United States Patent [19]
Yamashita

[11] Patent Number: 5,357,060
[45] Date of Patent: Oct. 18, 1994

[54] PATTERN STRUCTURE OF A PRINTED CIRCUIT BOARD

[75] Inventor: Koji Yamashita, Tokyo, Japan
[73] Assignee: NEC Corporation, Japan
[21] Appl. No.: 939,016
[22] Filed: Sep. 2, 1992

[30] Foreign Application Priority Data

Sep. 4, 1991 [JP] Japan .............. 3-070736[U]

[51] Int. Cl.$^5$ .............................. H05K 1/00
[52] U.S. Cl. .................. 174/267; 361/767; 361/777
[58] Field of Search .............. 174/255, 260, 267; 361/400, 403, 409, 417, 418, 767, 772, 777; 439/83; 228/180.2

[56] References Cited

U.S. PATENT DOCUMENTS 4,996,629  2/1991  Christiansen et al. .......... 361/400
5,048,747  9/1991  Clark et al. ................ 228/180.2

OTHER PUBLICATIONS

Wannemacher, J. R., *Stress Controlling Mounting Structures for Printed Circuit Boards,* US-SIR, May 7, 1991.

Primary Examiner—Leo P. Picard
Assistant Examiner—Cheryl R. Figlin
Attorney, Agent, or Firm—Laff, Whitesel, Conte & Saret

[57] ABSTRACT

A pattern structure of a printed circuit board for mounting various kinds of electronic chip parts. The printed circuit board has a pad in each of a circuit connecting portion and a ground circuit portion thereof. A broad continuous ground pattern is formed with cuts to provide the pad in the ground circuit portion with substantially the same size or area as the pad in the circuit connecting portion. The pad in the ground circuit portion is connected to copper foil surrounding the cuts.

5 Claims, 2 Drawing Sheets

PATTERN STRUCTURE OF A PRINTED CIRCUIT BOARD

BACKGROUND OF THE INVENTION

The present invention relates to the pattern structure of a printed circuit board for mounting various kinds of electronic chip parts.

It has been customary to solder electronic chip parts to patterns provided on a printed circuit board and implemented by, for example, copper foil. In the SMT (Surface Mounting Technology) art, the above-mentioned patterns are referred to as pads. In many cases, the pads are provided with a rectangular shape although the shape depends on the configuration of the portions of chip parts to be soldered. The pads located in a circuit connecting portion are often implemented as narrow patterns while the pads located in a ground circuit portion are often implemented as a broad continuous pattern, i.e., solid pattern. Generally, a printed circuit board is provided with a solder resist coating on the surface thereof to prevent solder from depositing in unexpected portions or from bridging. In the circuit connecting portion, the pad is spaced apart from the solder resist coating by a gap. In the ground circuit portion, the pad is formed by part of a solder resist coating provided on a solid ground pattern for a grounding purpose.

The problem with the above-described conventional pattern structure is that the pad in the circuit connecting portion and the pad in the ground circuit portion are often different in size or area from each other. When a chip part is soldered to such pads by, for example, a fellow process, the temperature elevation rate differs from one pad to the other pad since the pattern area, i.e., the area of copper foil greatly differs. The difference in temperature elevation rate results in a difference in the melting time of solder and, therefore, a difference in surface tension. This aggravates the probability of a so-called tombstone phenomenon wherein the chip stands. Furthermore, since the two pads are different in area from each other and since the amount of solder is fixed, the spread of solder and, therefore, the configuration of the resulting fillet differs from one pad to the other pad, making the quality check troublesome.

SUMMARY OF THE INVENTION

It is therefore an object of the present invention to provide a pattern structure of a printed circuit board adaptive to the miniaturization of chip parts, i.e., miniature and dense packaging.

It is another object of the present invention to provide a pattern structure of a printed circuit board which noticeably reduces the tombstone phenomenon by substantially equalizing the temperature elevation rate in the event of reflow.

It is another object of the present invention to provide a pattern structure of a printed circuit board which facilitates the quality check by forming fillets of identical shape.

A pattern structure of a printed circuit board for a surface mounting device of the present invention comprises a first pad provided in a circuit connecting portion of the printed circuit board, a second pad provided in a solid ground pattern portion of the printed circuit board, and a cut formed in the solid ground pattern portion, whereby the first pad and the second pad have substantially the same area as each other.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
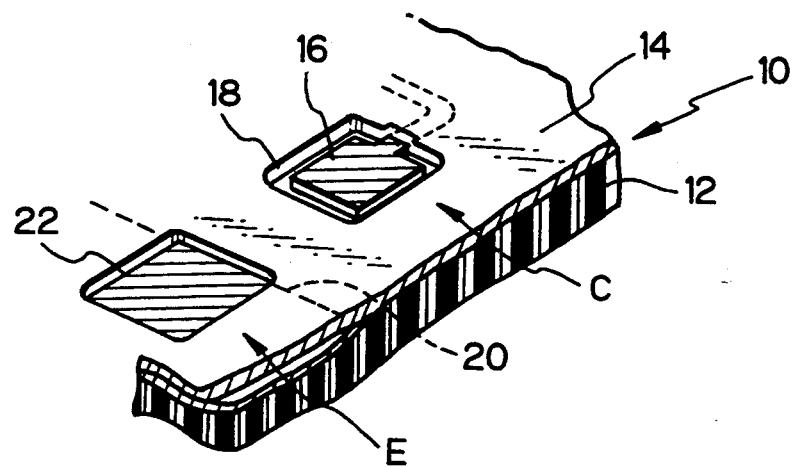
FIG. 1 is a perspective view of a conventional pattern structure of a printed circuit board.
Figure 2:
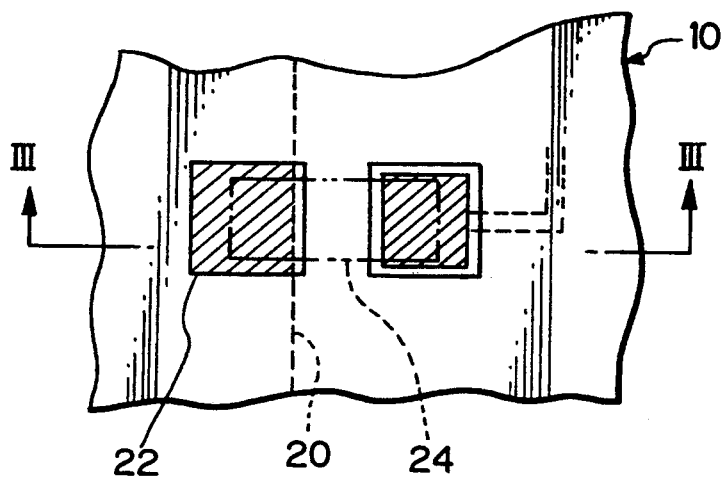
FIG. 2 is a plan view of the pattern structure shown in FIG. 1.
Figure 3:
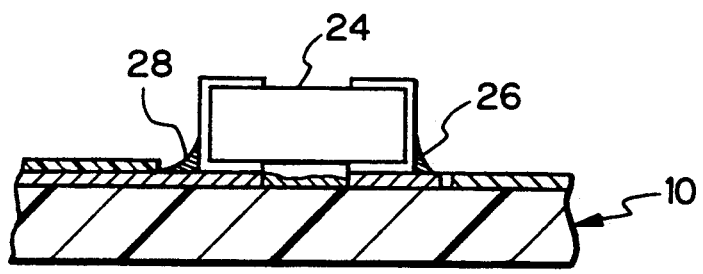
FIG. 3 is a section along line III—III of FIG. 2.

Referring to FIGS. 1-3, a conventional pattern structure of a printed circuit board is shown. As shown, a printed circuit board, generally 10, has a substrate 12 on which a solder resist coating 14 is provided. In a circuit connecting portion C forming part of the printed circuit board 10, a pad 16 is located and provided with a square shape, as indicated by hatching in the figures. The pad 16 is spaced apart from the solder resist coating 14 by a gap 18 of 0.1 millimeter to 0.2 millimeter in consideration of positional deviations. In a ground circuit portion E forming another part of the printed circuit board 10, a broad continuous, or solid, ground pattern 20 is provided on the substrate 12. Specifically, a pad 22 located in the ground circuit portion E is constituted by part of a solder resist coating provided on the ground pattern 20 and also provided with a rectangular shape, as indicated by hatching.

As shown in FIGS. 1 and 2, the pads 16 and 22 are different in size from each other, i.e., the pad 16 is smaller than the pad 22 by an area corresponding to the gap 18. Therefore, when an electronic chip part 24 is soldered to the pads 16 and 22, the previously stated tombstone phenomenon occurs. Further, as shown in FIG. 3, fillets 26 and 28 surrounding the chip part 24 are different in shape from each other, resulting in troublesome quality check.

Figure 4:
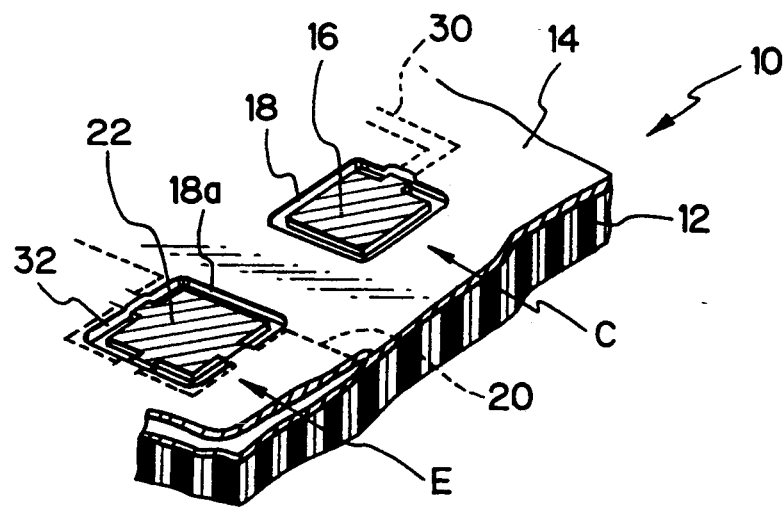
FIG. 4 is a perspective view of a pattern structure of a printed circuit board embodying the present invention.
Figure 5:
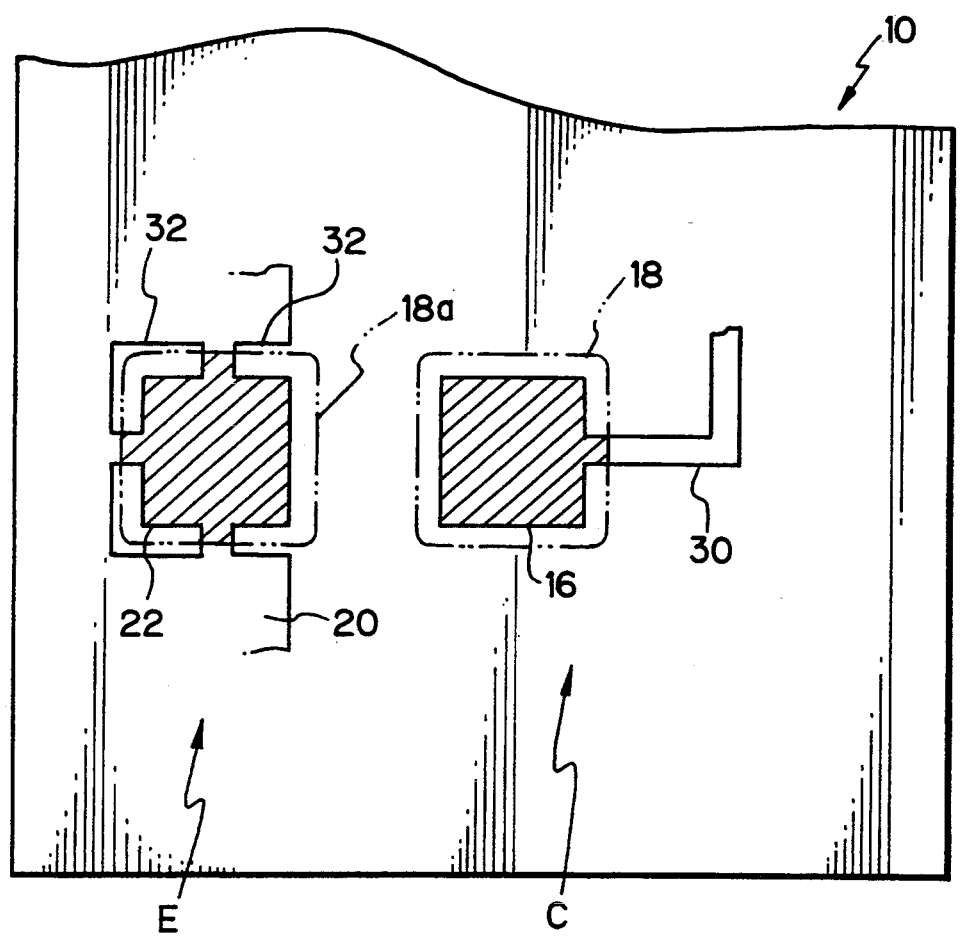
FIG. 5 is a plan view of the structure shown in FIG. 4.

A reference will be made to FIGS. 4 and 5 for describing a pattern structure of a printed circuit board embodying the present invention and free from the above-described problems. In the figures, the same or similar constituents to the constituents of the conventional structure are designated by the same reference numerals and will not be described to avoid redundancy. In FIGS. 4 and 5, the reference numeral 30 designates a circuit pattern. In the illustrative embodiment, a solid ground pattern 20 is partly removed to form cuts 32 around a pad 22, located in a ground circuit portion E. As a result, gaps 18a corresponding to a gap 18 which surrounds a pad 16 is formed around the pad 22. Hence, the pads 16 and 22 have substantially the same size or area as each other. The pad 22 is connected to copper foil which forms the ground pattern 20 surrounding the recesses 32.

In summary, the embodiment forms the cuts 32 in the ground pattern 20 to thereby provide the pads 16 and 22 with substantially the same area and connects the copper foil surrounding the precesses 32 and the pad 22. In this configuration, the pads 16 and 22 are heated at substantially the same rate during reflow, noticeably reducing the tombstone phenomenon. In addition, fillets to be formed around the pads 16 and 22 will have the same shape since the pads 16 and 22 have substantially the same area, facilitating the quality check.

Various modifications will become possible for those skilled in the art after receiving the teachings of the present disclosure without departing from the scope thereof.

What is claimed is:

1. A pattern structure of a printed circuit board for a surface mounting device, comprising:
   a first pad connected to a signal line;
   a second pad provided in a ground pattern portion; and
   a cut formed in a peripheral portion of said second pad to trim said second pad to have an area that is substantially the same as the area of said first pad.

2. A pattern structure as claimed in claim 1, wherein said first pad and said second pad are on the same surface of a single printed circuit board.

3. A pattern structure as claimed in claim 1, wherein a width of said cut of said second pad and a width of a remaining pattern of a connecting portion, which is defined by said cut and which is contiguous with said ground pattern portion, are such that said first pad and said second pad are heated at substantially a same rate during reflow.

4. A pattern structure as claimed in claim 3, wherein said remaining pattern of said connecting portion is positioned at each side of said pad.

5. A pattern structure as claimed in claim 1, wherein peripheries of said first pad and said second pad are covered with a solder resist.

* * * * *